(12) United States Patent
Kono et al.

(10) Patent No.: US 12,552,969 B2
(45) Date of Patent: Feb. 17, 2026

(54) MULTI-LAYERED POLYIMIDE FILM, METAL-CLAD LAMINATE, AND METHOD FOR PRODUCING MULTI-LAYERED POLYIMIDE FILM

(71) Applicant: KANEKA CORPORATION, Osaka (JP)

(72) Inventors: Fumiya Kono, Otsu (JP); Takayoshi Akiyama, Otsu (JP); Mami Akisada, Otsu (JP); Mari Uno, Settsu (JP)

(73) Assignee: KANEKA CORPORATION, Osaka (JP)

( * ) Notice: Subject to any disclaimer, the term of this patent is extended or adjusted under 35 U.S.C. 154(b) by 395 days.

(21) Appl. No.: 18/133,393

(22) Filed: Apr. 11, 2023

(65) Prior Publication Data

US 2023/0250317 A1 Aug. 10, 2023

Related U.S. Application Data

(63) Continuation of application No. PCT/JP2021/037569, filed on Oct. 11, 2021.

(30) Foreign Application Priority Data

Oct. 14, 2020 (JP) .................. 2020-173047
Jul. 1, 2021 (JP) .................. 2021-110117

(51) Int. Cl.
C09J 7/38 (2018.01)
C09J 7/25 (2018.01)
H05K 1/03 (2006.01)

(52) U.S. Cl.
CPC . *C09J 7/38* (2018.01); *C09J 7/25* (2018.01); *H05K 1/036* (2013.01); *H05K 1/0393* (2013.01); *H05K 2201/0154* (2013.01)

(58) Field of Classification Search
None
See application file for complete search history.

(56) References Cited

U.S. PATENT DOCUMENTS

2013/0011687 A1* 1/2013 Matsutani ............ C08G 73/105
428/458

FOREIGN PATENT DOCUMENTS

| JP | 2018145303 A | 9/2018 |
| JP | 2019014062 A | 1/2019 |
| WO | 2018061727 A1 | 4/2018 |

OTHER PUBLICATIONS

English translation of an International Preliminary Report on Patentability (IPRP) and Written Opinion dated Apr. 27, 2023, issued by The International Bureau of WIPO, in related International Application No. PCT/JP2021/037569 (6 pages).

* cited by examiner

*Primary Examiner* — Cheng Yuan Huang
(74) *Attorney, Agent, or Firm* — Osha Bergman Watanabe & Burton LLP

(57) ABSTRACT

A multi-layered polyimide film includes a non-thermoplastic polyimide layer, and an adhesive layer that is disposed on at least one surface of the non-thermoplastic polyimide layer and contains polyimide. A dielectric loss tangent of the non-thermoplastic polyimide layer at a frequency of 10 GHz, a temperature of 23° C. and a relative humidity of 50% is 0.0030 or less. The adhesive layer has no melting peak or has a melting heat of 1.0 J/g or less at a melting peak in a temperature range of 100° C. or higher and 420° C. or lower. The polyimide contained in the adhesive layer has one or more tetracarboxylic dianhydride residues selected from a pyromellitic dianhydride residue and a 3,3',4,4'-biphenyltetracarboxylic dianhydride residue, and one or more diamine residues selected from a 1,3-bis(4-aminophenoxy)benzene residue and a 4,4'-diamino-2,2'-dimethylbiphenyl residue.

9 Claims, 1 Drawing Sheet

MULTI-LAYERED POLYIMIDE FILM, METAL-CLAD LAMINATE, AND METHOD FOR PRODUCING MULTI-LAYERED POLYIMIDE FILM

TECHNICAL FIELD

One or more embodiments of the present invention relate to a multi-layered polyimide film, a metal-clad laminate, and a method for producing a multi-layered polyimide film.

BACKGROUND

In recent years, demand for flexible printed circuit boards (hereinafter, sometimes referred to as "FPCs") has been growing with an expansion of demand for electronic products mainly including smartphones, tablet personal computers, notebook personal computers and the like. Among them, FPCs in which a multi-layered polyimide film including a thermoplastic polyimide layer as an adhesive layer is used as a material are excellent in heat resistance and flexibility, and therefore further growth of demand for these FPCs is expected.

In association with high-speed signal transmission in electronic devices in recent years, there has been an increasing demand for reduction of the dielectric constant and reduction of the dielectric loss tangent of an electronic substrate material for achieving an increased frequency of an electric signal propagating through a circuit. For suppressing the transmission loss of an electric signal, it is effective to reduce the dielectric constant and the dielectric loss tangent of an electronic substrate material. In recent years as early days of the IoT society, there has been a growing trend toward an increased frequency, and a substrate material has been desired in which a transmission loss can be suppressed even in a region of 10 GHz or more, for example.

As a film used for a circuit substrate that can be adapted to an increased frequency, a polyimide film that exhibits a low dielectric loss tangent is known, and for example. Patent Document 1 discloses a multi-layered polyimide film having a non-thermoplastic polyimide layer that exhibits a low dielectric loss tangent. Patent Document 2 discloses a multi-layered polyimide film including a thermoplastic polyimide layer on at least one surface of a non-thermoplastic polyimide layer and having a dielectric loss tangent of 0.004 or less at 10 GHz.

PATENT DOCUMENTS

Patent Document 1: Japanese Patent Laid-Open Publication No. 2018-145303
Patent Document 2: International Publication No. WO 2018/061727

However, a multi-layered polyimide film which has a reduced dielectric loss tangent while having a bond property to a metal layer (specifically, adhesion to the metal layer, embeddability in the metal layer or the like) and which is excellent in productivity is difficult to obtain only by the techniques disclosed in Patent Documents 1 and 2.

SUMMARY

One or more embodiments of the present invention have been made in view of the above, and one or more embodiments of the present invention provide a multi-layered polyimide film which has a reduced dielectric loss tangent while having a bond property to a metal layer and which is excellent in productivity, a method for producing the multi-layered polyimide film, and a metal-clad laminate in which the multi-layered polyimide film is used.

A multi-layered polyimide film according to one or more embodiments of the present invention includes a non-thermoplastic polyimide layer, and an adhesive layer that is disposed on at least one surface of the non-thermoplastic polyimide layer and contains polyimide. A dielectric loss tangent of the non-thermoplastic polyimide layer at a frequency of 10 GHz, a temperature of 23° C. and a relative humidity of 50% is 0.0030 or less. The adhesive layer has no melting peak or has a melting heat of 1.0 J/g or less at a melting peak in a temperature range of 100° C. or higher and 420° C. or lower. The polyimide contained in the adhesive layer has one or more tetracarboxylic dianhydride residues selected from the group consisting of a pyromellitic dianhydride residue and a 3,3',4,4'-biphenyltetracarboxylic dianhydride residue, and one or more diamine residues selected from the group consisting of a 1,3-bis(4-aminophenoxy) benzene residue and a 4,4'-diamino-2,2'-dimethylbiphenyl residue.

In a multi-layered polyimide film according to one or more embodiments of the present invention, the adhesive layer is disposed on each of both surfaces of the non-thermoplastic polyimide layer.

In a multi-layered polyimide film according to one or more embodiments of the present invention, the adhesive layer contains tertiary amine at a content ratio of 1 ppm by mass or more.

In a multi-layered polyimide film according to one or more embodiments of the present invention, the non-thermoplastic polyimide layer contains tertiary amine at a content ratio of 1 ppm by mass or more.

In a multi-layered polyimide film according to one or more embodiments of the present invention, the non-thermoplastic polyimide contained in the non-thermoplastic polyimide layer has one or more tetracarboxylic dianhydride residues selected from the group consisting of a 3,3',4,4'-biphenyltetracarboxylic dianhydride residue and a 4,4'-oxydiphthalic anhydride residue, and one or more diamine residues selected from the group consisting of a p-phenylenediamine residue and a 1,3-bis(4-aminophenoxy)benzene residue.

In a multi-layered polyimide film according to one or more embodiments of the present invention, the non-thermoplastic polyimide contained in the non-thermoplastic polyimide layer has a p-phenylenediamine residue, and the polyimide contained in the adhesive layer has no p-phenylenediamine residue.

In a multi-layered polyimide film according to one or more embodiments of the present invention, the adhesive layer has no melting peak in the temperature range of 100° C. or higher and 420° C. or lower.

A metal-clad laminate according to one or more embodiments of the present invention includes a multi-layered polyimide film according to one or more embodiments of the present invention, and a metal layer disposed on a main surface of at least one of the adhesive layers of the multi-layered polyimide film.

A method for producing a multi-layered polyimide film according to one or more embodiments of the present invention is a method for producing a multi-layered polyimide film including a non-thermoplastic polyimide layer, and an adhesive layer that is disposed on at least one surface of the non-thermoplastic polyimide layer and contains polyimide, the method including an application step, a gel film forming step and an imidization step. In the application step, a non-thermoplastic polyimide layer forming solution containing polyamide acid, acetic anhydride and tertiary amine, and an adhesive layer forming solution containing polyamide acid are applied onto a support by a coextrusion-casting application method. In the gel film forming step, a coating film obtained in the application step is dried to form a gel film having a self-supporting property. In the imidization step, the gel film obtained in the gel film forming step is heated under a condition of a maximum temperature of 360° C. or higher to imidize the polyamide acid in the non-thermoplastic polyimide layer forming solution and the polyamide acid in the adhesive layer forming solution. In the application step, the polyamide acid contained in the adhesive layer forming solution has a pyromellitic dianhydride residue, a 3,3',4,4'-biphenyltetracarboxylic dianhydride residue, a 1,3-bis(4-aminophenoxy)benzene residue, and a 4,4'-diamino-2,2'-dimethylbiphenyl residue. In the application step, the polyamide acid contained in the non-thermoplastic polyimide layer forming solution has one or more tetracarboxylic dianhydride residues selected from the group consisting of a 3,3',4,4'-biphenyltetracarboxylic dianhydride residue and a 4,4'-oxydiphthalic anhydride residue, and one or more diamine residues selected from the group consisting of a p-phenylenediamine residue and a 1,3-bis(4-aminophenoxy)benzene residue.

In a method for producing a multi-layered polyimide film according to one or more embodiments of the present invention, in the application step, the polyamide acid contained in the non-thermoplastic polyimide layer forming solution has a p-phenylenediamine residue, and the polyamide acid contained in the adhesive layer forming solution has no p-phenylenediamine residue.

In a method for producing a multi-layered polyimide film according to one or more embodiments of the present invention, in the imidization step, a time for heating the gel film at the maximum temperature is 10 seconds or more and 300 seconds or less.

In a method for producing a multi-layered polyimide film according to one or more embodiments of the present invention, the adhesive layer has no melting peak or has a melting heat of 1.0 J/g or less at a melting peak in the temperature range of 100° C. or higher and 420° C. or lower.

In a method for producing a multi-layered polyimide film according to one or more embodiments of the present invention, the adhesive layer has no melting peak in the temperature range of 100° C. or higher and 420° C. or lower.

In a method for producing a multi-layered polyimide film according to one or more embodiments of the present invention, the non-thermoplastic polyimide layer has a dielectric loss tangent of 0.0030 or less at a frequency of 10 GHz, a temperature of 23° C. and a relative humidity of 50%.

According to one or more embodiments of the present invention, it is possible to provide a multi-layered polyimide film which has a reduced dielectric loss tangent while having a bond property to a metal layer and which is excellent in productivity, a method for producing the multi-layered polyimide film, and a metal-clad laminate in which the multi-layered polyimide film is used.

DETAILED DESCRIPTION

Figure 1:
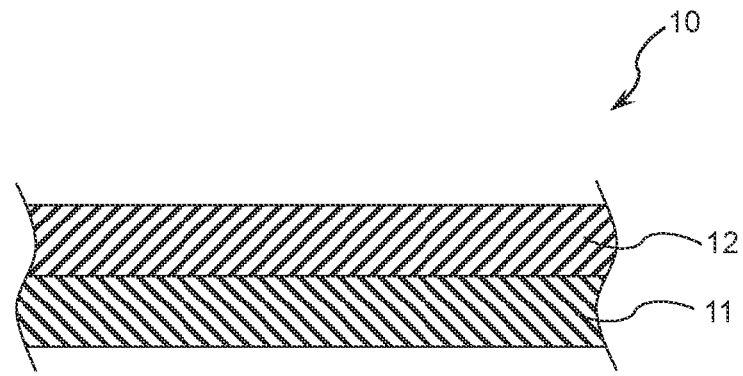
FIG. 1 is a sectional view showing an example of a multi-layered polyimide film according to one or more embodiments of the present invention.

One or more embodiments of the present invention will be described in detail below, but one or more embodiments of the present invention are not limited to these embodiments. The academic documents and patent documents mentioned herein are incorporated herein by reference in their entirety.

First, terms used herein will be described. The "structural unit" refers to a repeating unit forming a polymer. The "polyimide" is a polymer containing a structural unit represented by the following general formula (1) (hereinafter, sometimes referred to as a "structural unit (1)").

[Chemical Formula 1]

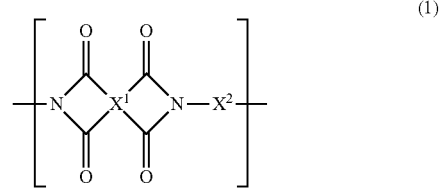

In the general formula (1), $X^1$ represents a tetracarboxylic dianhydride residue (tetravalent organic group derived from tetracarboxylic dianhydride), and $X^2$ represents a diamine residue (divalent organic group derived from diamine).

The content ratio of the structural unit (1) to all structural units forming the polyimide may be, for example, 50 mol % or more and 100 mol % or less, 60 mol % or more and 100 mol % or less, 70 mol % or more and 100 mol % or less, 80 mol % or more and 100 mol % or less, 90 mol % or more and 100 mol % or less, or 100 mol %.

The "polyamide acid" is a polymer containing a structural unit represented by the following general formula (2) (hereinafter, sometimes referred to as a "structural unit (2)").

[Chemical Formula 2]

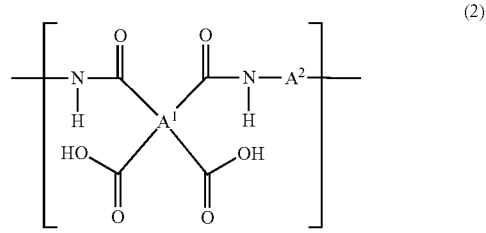

In the general formula (2). $A^1$ represents a tetracarboxylic dianhydride residue (tetravalent organic group derived from tetracarboxylic dianhydride), and $A^2$ represents a diamine residue (divalent organic group derived from diamine).

The content ratio of the structural unit (2) to all structural units forming the polyamide acid may be, for example, 50 mol % or more and 100 mol % or less, 60 mol % or more and 100 mol % or less, 70 mol % or more and 100 mol % or less, 80 mol % or more and 100 mol % or less, 90 mol % or more and 100 mol % or less, or 100 mol %.

The polyimide is an imidized product of polyamide acid. Thus, when the content ratio of the structural unit (2) to all structural units forming the polyamide acid is 100 mol %, the polyimide which is an imidized product of polyamide acid has a residue represented by $A^1$ in the general formula (2) as $X^1$ in the general formula (1), and a residue represented by $A^2$ in the general formula (2) as $X^2$ in the general formula (1).

The "dielectric loss tangent" is a dielectric loss tangent at a frequency of 10 GHz, a temperature of 23° C. and a relative humidity of 50%. The method for measuring the dielectric loss tangent is identical or similar to the method in examples described later.

The "non-thermoplastic polyimide" refers to polyimide that retains a film shape (flat film shape) when fixed in a metallic fixation frame in a film state and heated under the condition of a heating temperature of 380° C. for 2 minutes.

The "main surface" of a layered material (more specifically, non-thermoplastic polyimide layer, adhesive layer, multi-layered polyimide film, a metal layer or the like) refers to a surface orthogonal to the thickness direction of the layered material.

Hereinafter, the name of a compound may be followed by the term "-based" to collectively refer to the compound and derivatives thereof. The tetracarboxylic dianhydride may be referred to as "acid dianhydride". The bond property to the metal layer may be referred to simply as a "bond property".

In the drawings that are referred to in the following description, mainly relevant components are schematically shown for easy understanding, and the size, the number, the shape and the like of each illustrated component may be different from the actual counterparts for convenience of preparing the drawings. For convenience of description, there may be cases where in the drawings that are described later, the same component parts as those in the drawings described previously are given the same symbols, and descriptions thereof are omitted.

Hereinafter, one or more embodiments of the present invention will be described in the order of a method for producing a multi-layered polyimide film, a multi-layered polyimide film and a metal-clad laminate.

First Embodiment: Method for Producing Multi-Layered Polyimide Film

A method for producing a multi-layered polyimide film according to a first embodiment of the present invention is a method for producing a multi-layered polyimide film including a non-thermoplastic polyimide layer, and an adhesive layer that is disposed on at least one surface of the non-thermoplastic polyimide layer and contains polyimide, the method including an application step, a gel film forming step and an imidization step. In the application step, a non-thermoplastic polyimide layer forming solution containing polyamide acid, acetic anhydride and tertiary amine, and an adhesive layer forming solution containing polyamide acid are applied onto a support by a coextrusion-casting application method. In the gel film forming step, a coating film obtained in the application step is dried to form a gel film having a self-supporting property. In the imidization step, the gel film obtained in the gel film forming step is heated under the condition of a maximum temperature of 360° C. or higher to imidize the polyamide acid in the non-thermoplastic polyimide layer forming solution and the polyamide acid in the adhesive layer forming solution. In the application step, the polyamide acid contained in the adhesive layer forming solution has a pyromellitic dianhydride residue, a 3,3',4,4'-biphenyltetracarboxylic dianhydride residue, a 1,3-bis(4-aminophenoxy)benzene residue, and a 4,4'-diamino-2,2'-dimethylbiphenyl residue. In the application step, the polyamide acid contained in the non-thermoplastic polyimide layer forming solution has one or more tetracarboxylic dianhydride residues selected from the group consisting of a 3,3',4,4'-biphenyltetracarboxylic dianhydride residue and a 4,4'-oxydiphthalic anhydride residue, and one or more diamine residues selected from the group consisting of a p-phenylenediamine residue and a 1,3-bis(4-aminophenoxy)benzene residue.

The "coextrusion-casting application method" is a method in which a coating film is formed by using an extrusion molding machine having an extrusion molding die of two or more layers. Specifically, the coextrusion-casting application method is a method in which from a lip opening portion of an extrusion molding die, a non-thermoplastic polyimide layer forming solution and an adhesive layer forming solution are extruded into a thin film with two or more layers to form a coating film having a layer configuration of two or more layers on a support.

Hereinafter, the gel film having a self-supporting property may be referred to simply as a "gel film". The pyromellitic dianhydride is may be referred to as "PMDA". The 3,3',4,4'-biphenyltetracarboxylic dianhydride may be referred to as "BPDA". The 1,3-bis(4-aminophenoxy)benzene may be referred to as "TPE-R". The 4,4'-diamino-2,2'-dimethylbiphenyl may be referred to as "m-TB". The p-phenylenediamine may be referred to as "PDA". The 4,4'-oxydiphthalic anhydride may be referred to as "ODPA". The non-thermoplastic polyimide contained in the non-thermoplastic polyimide layer may be referred to simply as "non-thermoplastic polyimide".

The method for producing a multi-layered polyimide film according to the first embodiment enables enhancement of productivity and production of a multi-layered polyimide film which has a reduced dielectric loss tangent while having a bond property to a metal layer. The reason for this is presumed as follows.

In the production method according to the first embodiment, a coextrusion-casting application method, and a method in which imidization is accelerated by using acetic anhydride and tertiary amine (chemical imidization method) are adopted, so that the film forming step is simplified, and the imidization time can be shortened. Thus, the method for producing a multi-layered polyimide film according to the first embodiment enables enhancement of productivity.

In the first embodiment, the polyamide acid contained in the non-thermoplastic polyimide layer forming solution has one or more acid dianhydride residues selected from the group consisting of a BPDA residue and an ODPA residue and one or more diamine residues selected from the group consisting of a PDA residue and a TPE-R residue, and the polyamide acid is imidized by a chemical imidization method under the condition of a maximum temperature of 360° C. or higher. When a chemical imidization method is adopted, the imidization reaction is carried out more quickly than that in a thermal imidization method, and therefore, in the first embodiment, the imidization reaction of polyamide acid is carried out with the solvent amount being relatively large. In the first embodiment, the polyamide acid having a specific residue is imidized by a chemical imidization method under the condition of a maximum temperature of 360° C. or higher, and therefore the packing property of the resulting non-thermoplastic polyimide is enhanced. As a result, the non-thermoplastic polyimide layer obtained by the production method according to the first embodiment tends to have a low dielectric loss tangent. Thus, the method for producing a multi-layered polyimide film according to the first embodiment enables reduction of the dielectric loss tangent of the multi-layered polyimide film.

In the first embodiment, since the polyamide acid contained in the adhesive layer forming solution has a PMDA residue, a BPDA residue, a TPE-R residue and a m-TB residue, a good shape of the film containing the polyamide acid in the adhesive layer forming solution can be maintained without deteriorating the bond property of the resulting adhesive layer in imidization performed under the condition of a maximum temperature of 360° C. or higher. Thus, the method for producing a multi-layered polyimide film according to the first embodiment enables securement of a bond property to a metal layer.

In the first embodiment, it is preferable that the polyamide acid contained in the non-thermoplastic polyimide layer forming solution has a PDA residue and the polyamide acid contained in the adhesive layer forming solution has no PDA residue for obtaining a multi-layered polyimide film which has a further reduced dielectric loss tangent while having a high bond property to a metal layer.

Hereinafter, steps in the production method according to the first embodiment will be described in detail.

[Application Step]

(Non-Thermoplastic Polyimide Layer Forming Solution)

The non-thermoplastic polyimide layer forming solution is a solution for forming a non-thermoplastic polyimide layer which is a core layer of the multi-layered polyimide film. The non-thermoplastic polyimide layer forming solution contains polyamide acid, acetic anhydride and tertiary amine.

The polyamide acid contained in the non-thermoplastic polyimide layer forming solution (hereinafter, sometimes referred to as "non-thermoplastic polyamide acid") has one or more acid dianhydride residues selected from the group consisting of a BPDA residue and an ODPA residue and one or more diamine residues selected from the group consisting of a PDA residue and a TPE-R residue. The non-thermoplastic polyamide acid may include one or more polyamide acids, and may include one polyamide acid.

The non-thermoplastic polyamide acid may have, in addition to one or more acid dianhydride residues selected from the group consisting of a BPDA residue and an ODPA residue, other acid dianhydride residues. Examples of the acid dianhydride (monomer) for forming other acid dianhydride residues (acid dianhydride residues other than the BPDA residue and the ODPA residue) include PMDA, 2,3,6,7-naphthalenetetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 3,4'-oxydiphthalic anhydride, 2,2-bis(3,4-dicarboxyphenyl) propane dianhydride, 3,4,9,10-perylene tetracarboxylic dianhydride, 1,1-bis(2,3-dicarboxyphenyl)ethane dianhydride, 1,1-bis(3,4-dicarboxyphenyl)ethane dianhydride, p-phenylenebis(trimellitic acid monoester acid anhydride), ethylenebis(trimellitic acid monoester acid anhydride), bisphenol A bis(trimellitic acid monoester acid anhydride), and derivatives thereof.

For obtaining a multi-layered polyimide film which has a further reduced dielectric loss tangent while having high heat resistance, the other acid dianhydride residue may be a PMDA residue.

For obtaining a multi-layered polyimide film which has a further reduced dielectric loss tangent, the total content ratio of the BPDA residue and the ODPA residue to all acid dianhydride residues forming the non-thermoplastic polyamide acid may be 50 mol % or more, 70 mol % or more, 80 mol % or more, 90 mol % or more, or 100 mol %.

When the PMDA residue is used as the other acid dianhydride residue, the total content ratio of the BPDA residue, the ODPA residue and the PMDA residue to all acid dianhydride residues forming the non-thermoplastic polyamide acid may be 50 mol % or more, 70 mol % or more, 80 mol % or more, 90 mol % or more, 95 mol % or more, or 100 mol %, for obtaining a multi-layered polyimide film which has a further reduced dielectric loss tangent while having high heat resistance.

For obtaining a multi-layered polyimide film which has a further reduced dielectric loss tangent, it is preferable that the non-thermoplastic polyamide acid has two acid dianhydride residues: the BPDA residue and the ODPA residue. For obtaining a multi-layered polyimide film which has a further reduced dielectric loss tangent while having high heat resistance, it is preferable that the non-thermoplastic polyamide acid has three acid dianhydride residues: the BPDA residue, the ODPA residue and the PMDA residue.

For obtaining a multi-layered polyimide film which has a further reduced dielectric loss tangent, the content ratio of the BPDA residue to all acid dianhydride residues forming the non-thermoplastic polyamide acid may be 40 mol % or more and 80 mol % or less, or 50 mol % or more and 70 mol % or less.

For obtaining a multi-layered polyimide film which has a further reduced dielectric loss tangent, the content ratio of the ODPA residue to all acid dianhydride residues forming the non-thermoplastic polyamide acid may be 10 mol % or more and 50 mol % or less, or 20 mol % or more and 40 mol % or less.

For obtaining a multi-layered polyimide film which has a further reduced dielectric loss tangent while having high heat resistance, the content ratio of the PMDA residue to all acid dianhydride residues forming the non-thermoplastic polyamide acid may be 1 mol % or more and 10 mol % or less, or 2 mol % or more and 8 mol % or less.

The non-thermoplastic polyamide acid has, in addition to the above-described acid dianhydride residues, one or more diamine residues selected from the group consisting of a PDA residue and a TPE-R residue.

The non-thermoplastic polyamide acid may have, in addition to one or more diamine residues selected from the group consisting of a PDA residue and a TPE-R residue, other diamine residues. Examples of the diamine (monomer) for forming other diamine residues (diamine residues other than the PDA residue and the TPE-R residue) include 1,4-bis(4-aminophenoxy)benzene, 4,4'-diaminodiphenylpropane, 4,4'-diaminodiphenylmethane, 4,4'-diaminodiphenyl sulfide, 3,3'-diaminodiphenyl sulfone, 4,4'-diaminodiphenyl sulfone, 3,3'-diaminodiphenyl ether, 3,4'-diaminodiphenyl ether, 1,5-diaminonaphthalene, 4,4'-dianunodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,3-diaminobenzene, 1,2-diaminobenzene, and derivatives thereof.

For obtaining a multi-layered polyimide film which has a further reduced dielectric loss tangent, the total content ratio of the PDA residue and the TPE-R residue to all diamine residues forming the non-thermoplastic polyamide acid may be 50 mol % or more, 70 mol % or more, 80 mol % or more, 90 mol % or more, 95 mol % or more, or 100 mol %.

For obtaining a multi-layered polyimide film which has a further reduced dielectric loss tangent, it is preferable that the non-thermoplastic polyamide acid has two diamine residues: the PDA residue and the TPE-R residue.

For obtaining a multi-layered polyimide film which has a further reduced dielectric loss tangent, the content ratio of the PDA residue to all diamine residues forming the non-thermoplastic polyamide acid may be 60 mol % or more and 95 mol % or less, or 70 mol % or more and 90 mol % or less.

For obtaining a multi-layered polyimide film which has a further reduced dielectric loss tangent, the content ratio of the TPE-R residue to all diamine residues forming the non-thermoplastic polyamide acid may be 5 mol % or more and 40 mol % or less, or 10 mol % or more and 30 mol % or less.

As the method for producing (synthesizing) the non-thermoplastic polyamide acid, any of known methods and combinations thereof can be used. Specific examples of the method for producing (synthesizing) a non-thermoplastic polyamide acid include a method in which diamine and tetracarboxylic dianhydride are reacted in an organic solvent. It is preferable that the substance amount of diamine and the substance amount of tetracarboxylic dianhydride in the reaction are substantially the same. When non-thermoplastic polyamide acid is synthesized using diamine and tetracarboxylic dianhydride, desired polyamide acid (polymer of diamine and tetracarboxylic dianhydride) can be obtained by adjusting the substance amount of diamine (amount of each diamine when a plurality of diamines are used) and the substance amount of tetracarboxylic dianhydride (amount of each tetracarboxylic dianhydride when a plurality of tetracarboxylic dianhydrides are used). The molar fraction of each residue in the non-thermoplastic polyamide acid is equal to, for example, the molar fraction of each monomer (each of diamine and tetracarboxylic dianhydride) used for synthesis of the non-thermoplastic polyamide acid. The temperature condition for the reaction of diamine with tetracarboxylic dianhydride, i.e. the reaction for synthesis of non-thermoplastic polyamide acid is not particularly limited, and is, for example, in the range of 10° C. or higher and 150° C. or lower. The time for the synthesis reaction of the non-thermoplastic polyamide acid is in the range of 10 minutes or more and 30 hours or less. Any method for adding a monomer may be used for synthesis of non-thermoplastic polyamide acid.

The non-thermoplastic polyimide layer forming solution contains acetic anhydride as a dehydrating and ring-closing agent and tertiary amine as a catalyst in addition to non-thermoplastic polyamide acid. Since the non-thermoplastic polyimide layer forming solution contains acetic anhydride and tertiary amine, imidization is accelerated. Examples of the tertiary amine include aliphatic tertiary amine, aromatic tertiary amine, and heterocyclic tertiary amine. For easily accelerating imidization, the tertiary amine may be heterocyclic tertiary amine, or one or more selected from the group consisting of a pyridine compound having an alkyl group at the β-position and/or the γ-position (more specifically. β-picoline, γ-picoline, 3,5-dimethylpyridine or the like), pyridine and isoquinoline.

The added amount of the tertiary amine may be 0.5 times or more and 5.0 times or less, 0.7 times or more and 2.5 times or less, or 0.8 times or more and 2.0 times or less the amount of amide groups of the non-thermoplastic polyamide acid in terms of molar equivalent. The added amount of the acetic anhydride may be 0.5 times or more and 10.0 times or less, 0.7 times or more and 5.0 times or less, or 0.8 times or more and 3.0 times or less the amount of amide groups of the non-thermoplastic polyamide acid in terms of molar equivalent. Herein, the "amide group of non-thermoplastic polyamide acid" refers to an amide group generated by a polymerization reaction between diamine and tetracarboxylic dianhydride. When the tertiary amine and the acetic anhydride are added to a polyamide acid solution described later, they may be added directly without being dissolved in an organic solvent, or may be dissolved in an organic solvent, followed by addition of the resulting solution. In the method of direct addition without dissolution in an organic solvent, the reaction may rapidly proceed before diffusion of the tertiary amine and the acetic anhydride, resulting in generation of gel. Thus, it is preferable that a solution (imidization accelerator) obtained by dissolving the tertiary amine and the acetic anhydride in an organic solvent is added to the polyamide acid solution.

The non-thermoplastic polyimide layer forming solution is obtained by, for example, adding tertiary amine and acetic anhydride to a polyamide acid solution containing non-thermoplastic polyamide acid and an organic solvent. Examples of the organic solvent usable for the polyamide acid solution include urea-based solvents such as tetramethylurea and N,N-dimethylethylurea; sulfoxide-based solvents such as dimethyl sulfoxide; sulfone-based solvents such as diphenyl sulfone and tetramethyl sulfone; amide-based solvents such as N,N-dimethylacetamide, N,N-dimethylformamide (hereinafter, sometimes referred to as "DMF"), N,N-diethylacetamide. N-methyl-2-pyrrolidone and hexamethylphosphoric triamide: ester-based solvents such as γ-butyrolactone; alkyl halide-based solvents such as chloroform and methylene chloride; aromatic hydrocarbon-based solvents such as benzene and toluene; phenol-based solvents such as phenol and cresol; ketone-based solvents such as cyclopentanone; and ether-based solvents such as tetrahydrofuran, 1,3-dioxolane, 1,4-dioxane, dimethyl ether, diethyl ether, diethylene glycol diethyl ether, diethylene glycol dimethyl ether and p-cresol methyl ether. These solvents are normally used singly, and if necessary, two or more thereof may be used in combination as appropriate. When the non-thermoplastic polyamide acid is obtained by the polymerization method described above, the reaction solution (solution after reaction) itself may be a polyamide acid solution. In this case, the organic solvent in the polyamide acid solution is the organic solvent used in the reaction in the polymerization method. The solid non-thermoplastic polyamide acid obtained by removing the solvent from the reaction solution may be dissolved in an organic solvent to prepare a polyamide acid solution.

Additives such as a dye, a surfactant, a leveling agent, a plasticizer, silicone and a sensitizer may be added to the polyamide acid solution. In addition, a filler can be added to the polyamide acid solution for the purpose of improving various properties of the film such as slidability, heat conductivity, electrical conductivity, corona resistance and loop stiffness. Any filler may be used, and preferred examples thereof include fillers composed of silica, titanium oxide, alumina, silicon nitride, boron nitride, calcium hydrogen phosphate, calcium phosphate, mica or the like.

The concentration of the non-thermoplastic polyamide acid in the polyamide acid solution is not particularly limited, and may be, for example, 5 wt % or more and 35 wt % or less, or 8 wt % or more and 30 wt % or less, based on the total amount of the polyamide acid solution.

(Adhesive Layer Forming Solution)

The adhesive layer forming solution is a solution for forming an adhesive layer that is bonded to the metal layer. The adhesive layer forming solution contains polyamide acid. The adhesive layer forming solution may contain the above-described acetic anhydride and tertiary amine in addition to the polyamide acid. When the adhesive layer forming solution contains acetic anhydride and tertiary amine, the preferred ranges of the added amounts of acetic anhydride and the tertiary amine are the same, respectively, as the above-described preferred ranges of the added amounts in the non-thermoplastic polyimide layer forming solution. When the non-thermoplastic polyimide layer forming solution contains acetic anhydride and tertiary amine, the acetic anhydride and the tertiary amine are diffused from the non-thermoplastic polyimide layer forming solution to the adhesive layer forming solution in the imidization step, and therefore even if the adhesive layer forming solution does not contain acetic anhydride and tertiary amine, the polyamide acid in the adhesive layer forming solution can be imidized by a chemical imidization method.

The polyamide acid contained in the adhesive layer forming solution (hereinafter, sometimes referred to as "adhesive polyamide acid") has a PMDA residue, a BPDA residue, a TPE-R residue and a m-TB residue. The adhesive polyamide acid may include one or more polyamide acids, and may include one polyamide acid.

The adhesive polyamide acid may have, in addition to the PMDA residue and the BPDA residue, other acid dianhydride residues. Examples of the acid dianhydride (monomer) for forming other acid dianhydride residues (acid dianhydride residues other than the PMDA residue and the BPDA residue) include the same acid dianhydride as those exemplified above as the acid dianhydride for forming non-thermoplastic polyamide acid.

For obtaining a multi-layered polyimide film which is further excellent in bond property while having a further reduced dielectric loss tangent, the total content ratio of the PMDA residue and the BPDA residue to all acid dianhydride residues forming the adhesive polyamide acid may be 50 mol % or more, 70 mol % or more, 80 mol % or more, 90 mol % or more, 95 mol % or more, or 100 mol %.

For obtaining a multi-layered polyimide film which is further excellent in bond property while having a further reduced dielectric loss tangent, the content ratio of the PMDA residue to all acid dianhydride residues forming the adhesive polyamide acid may be 20 mol % or more and 80 mol % or less, or 30 mol % or more and 70 mol % or less.

For obtaining a multi-layered polyimide film which is further excellent in bond property while having a further reduced dielectric loss tangent, the content ratio of the BPDA residue to all acid dianhydride residues forming the adhesive polyamide acid may be 20 mol % or more and 80 mol % or less, or 30 mol % or more and 70 mol % or less.

The adhesive polyamide acid has, in addition to the above-described acid dianhydride residues, the TPE-R residue and the m-TB residue as diamine residues.

The adhesive polyamide acid may have, in addition to the TPE-R residue and the m-TB residue, other diamine residues. Examples of the diamine (monomer) for forming other diamine residues (diamine residues other than the TPE-R residue and the m-TB residue) include the same diamine as those exemplified above as the diamine for forming non-thermoplastic polyamide acid.

For obtaining a multi-layered polyimide film which is further excellent in bond property while having a further reduced dielectric loss tangent, the total content ratio of the TPE-R residue and the m-TB residue to all diamine residues forming the adhesive polyamide acid may be 50 mol % or more, 70 mol % or more, 80 mol % or more, 90 mol % or more, 95 mol % or more, or 100 mol %.

For obtaining a multi-layered polyimide film which is further excellent in bond property while having a further reduced dielectric loss tangent, the content ratio of the TPE-R residue to all diamine residues forming the adhesive polyamide acid may be 50 mol % or more and 95 mol % or less, or 60 mol % or more and 95 mol % or less.

For obtaining a multi-layered polyimide film which is further excellent in bond property while having a further reduced dielectric loss tangent, the content ratio of the m-TB residue to all diamine residues forming the adhesive polyamide acid may be 5 mol % or more and 50 mol % or less, or 5 mol % or more and 40 mol % or less.

Additives such as a dye, a surfactant, a leveling agent, a plasticizer, silicone and a sensitizer may be added to the adhesive layer forming solution. In addition, a filler can be added to the adhesive layer forming solution for the purpose of improving various properties of the film such as slidability, heat conductivity, electrical conductivity, corona resistance and loop stiffness. Any filler may be used, and preferred examples thereof include fillers composed of silica, titanium oxide, alumina, silicon nitride, boron nitride, calcium hydrogen phosphate, calcium phosphate, mica or the like.

The method for obtaining the solution for forming an adhesive layer forming solution (polyamide acid solution) is the same as the above-described method for obtaining a non-thermoplastic polyimide layer forming solution except that adhesive polyamide acid is synthesized instead of non-thermoplastic polyamide acid (a monomer for synthesizing adhesive polyamide acid is used).

The concentration of the adhesive polyamide acid in the adhesive layer forming solution (polyamide acid solution) is not particularly limited, and may be, for example, 5 wt % or more and 35 wt % or less, or 8 wt % or more and 30 wt % or less, based on the total amount of the adhesive layer forming solution.

For obtaining a multi-layered polyimide film which is further excellent in bond property while having a further reduced dielectric loss tangent, it is preferable that the method for producing a multi-layered polyimide film according to the first embodiment may satisfy the following condition 1, the following conditions 1 and 2, or the following conditions 1, 2 and 3.

Condition 1: The adhesive polyamide acid has only the PMDA residue and the BPDA residue as acid dianhydride residues, and only the TPE-R residue and the m-TB residue as diamine residues.

Condition 2: The non-thermoplastic polyamide acid has only the BPDA residue, the ODPA residue and the PMDA residue as acid dianhydride residues, and only the TPE-R residue and the PDA residue as diamine residues.

Condition 3: In the adhesive polyamide acid, a value obtained by dividing the substance amount of the PMDA residue by the substance amount of the BPDA residue is 0.8 or more and 1.2 or less, and a value obtained by dividing the substance amount of the TPE-R residue by the substance amount of the m-TB residue is 2.0 or more and 2.5 or less.

When the conditions 1 and 2 are satisfied, both the polyimide contained in the non-thermoplastic polyimide layer and the polyimide contained in the adhesive layer have the TPE-R residue, the PMDA residue and the BPDA residue, so that a multi-layered polyimide film excellent in adhesion between the non-thermoplastic polyimide layer and the adhesive layer is obtained.

(Application Method)

The application method in the application step is not particularly limited as long as it is a method in which the non-thermoplastic polyimide layer forming solution and the adhesive layer forming solution are applied onto a support by a coextrusion-casting application method. For example, from a lip opening portion of an extrusion molding die in a known extrusion molding machine, the non-thermoplastic polyimide layer forming solution and the adhesive layer forming solution are extruded into a thin film with two or more layers to form a coating film having a layer configuration of two or more layers on a support.

As the support used in the coextrusion-casting application method, a glass plate, an aluminum foil, a stainless steel endless belt, a stainless steel drum, or the like is suitably used.

[Gel Film Forming Step]

In the gel film forming step, a coating film obtained in the application step is dried to form a gel film having a self-supporting property. The coating film can be dried, for example, on a support. The drying temperature during drying of the coating film is, for example, 50° C. or higher and 200° C. or lower. The drying time during drying of the coating film is, for example, 1 minute or more and 100 minutes or less. A multi-stage drying step may be provided such that the coating film is heated at a temperature of 50° C. for 10 minutes, and then heated at 100° C. for 10 minutes.

[Imidization Step]

In the imidization step, the gel film obtained in the gel film forming step is heated under the condition of a maximum temperature of 360° C. or higher to imidize the polyamide acid in the non-thermoplastic polyimide layer forming solution and the polyamide acid in the adhesive layer forming solution. By this step, a multi-layered polyimide film which is a laminate of a non-thermoplastic polyimide layer and an adhesive layer is obtained. For further reducing the dielectric loss tangent, the maximum temperature in the imidization step may be 380° C. or higher. The upper limit of the maximum temperature in the imidization step may be, for example, 500° C., or 450° C. For obtaining a multi-layered polyimide film which is excellent in bond property while having a further reduced dielectric loss tangent, the heating time of the gel film at the maximum temperature may be 10 seconds or more and 300 seconds or less, 20 seconds or more and 200 seconds or less, 30 seconds or more and 150 seconds or less, or 60 seconds or more and 100 seconds or less. The laminate may be held at any temperature for any period of time until attainment of the maximum temperature.

The imidization step may be carried out in air, under reduced pressure or in an inert gas such as nitrogen. In the imidization step, it is preferable that the gel film is peeled off from the support, and heated with the gel film fixed at its end portion in order to avoid shrinkage of the film during curing. In the imidization step, the gel film may be heated while being stretched in a conveyance direction or a direction orthogonal to the conveyance direction.

[Multi-Layered Polyimide Film Obtained by Production Method According to First Embodiment]

Next, a multi-layered polyimide film obtained by the production method according to the first embodiment will be described with reference to the drawings.

FIG. 1 is a sectional view showing a multi-layered polyimide film obtained by the production method according to the first embodiment. As shown in FIG. 1, a multi-layered polyimide film 10 includes a non-thermoplastic polyimide layer 11, and an adhesive layer 12 disposed on at least one surface (one main surface) of the non-thermoplastic polyimide layer 11.

In the multi-layered polyimide film 10 shown in FIG. 1, the adhesive layer 12 is provided only on one surface of the non-thermoplastic polyimide layer 11, but the adhesive layer 12 may be provided on each of both surfaces (both main surfaces) of the non-thermoplastic polyimide layer 11 as in multi-layered polyimide films produced in examples described later. When the adhesive layer 12 is provided on each of both surfaces of the non-thermoplastic polyimide layer 11, the two adhesive layers 12 may contain the same kind of polyimide or mutually different kinds of polyimide. The thicknesses of the two adhesive layers 12 may be the same or different. In one or more embodiments of the present invention, two or more non-thermoplastic polyimide layers 11 and adhesive layers 12 may be provided. In the following description, the "multi-layered polyimide film 10" includes a film in which the adhesive layer 12 is provided only on one surface of the non-thermoplastic polyimide layer 11, a film in which the adhesive layer 12 is provided on each of both surfaces of the non-thermoplastic polyimide layer 11, and a film in which two or more non-thermoplastic polyimide layers 11 and adhesive layers 12 are provided.

The thickness of the multi-layered polyimide film 10 (total thickness of the layers) is, for example, 6 µm or more and 60 µm or less. It becomes easier to reduce the weight of FPC obtained and the bendability of FPC obtained is improved as the thickness of the multi-layered polyimide film 10 decreases. For easily reducing the weight of FPC while securing mechanical strength, and improving the bendability of FPC, the thickness of the multi-layered polyimide film 10 may be 7 µm or more and 60 µm or less, or 10 µm or more and 60 µm or less. The thickness of the multi-layered polyimide film 10 can be measured by using Laser Hologage.

For easily reducing the thickness of FPC while securing adhesion to the metal foil, the thickness of the adhesive layer 12 (thickness of each adhesive layer 12 when two or more adhesive layers 12 are provided) may be 1 µm or more and 15 µm or less. For easily adjusting the linear expansion coefficient of the multi-layered polyimide film 10, the thickness ratio between the non-thermoplastic polyimide layer 11 and the adhesive layer 12 (thickness of non-thermoplastic polyimide layer 11/thickness of adhesive layer 12) may be 55/45 or more and 95/5 or less. When a plurality of non-thermoplastic polyimide layers 11 and adhesive layers 12 are provided, the thickness ratio is a ratio of the total thickness of the non-thermoplastic polyimide layers 11 and the total thickness of the adhesive layers 12. Even when the number of adhesive layers 12 is large, it is preferable that the total thickness of the adhesive layers 12 is not more than the total thickness of the non-thermoplastic polyimide layers 11.

For suppressing warpage of the multi-layered polyimide film 10, it is preferable that the adhesive layer 12 is provided on each of both surfaces of the non-thermoplastic polyimide layer 11, and it is more preferable that the adhesive layers 12 containing the same kind of polyimide are provided on both surfaces of the non-thermoplastic polyimide layer 11. When the adhesive layer 12 is provided on each of both surfaces of the non-thermoplastic polyimide layer 11, the thicknesses of the two adhesive layers 12 may be the same for suppressing warpage of the multi-layered polyimide film 10. Even if the thicknesses of the two adhesive layers 12 are different from each other, warpage of the multi-layered polyimide film 10 can be suppressed when the thickness of the thinner adhesive layer 12 is in the range of 40% or more and less than 100% based on the thickness of the thicker adhesive layer 12.

For obtaining the multi-layered polyimide film 10 which has a further reduced dielectric loss tangent, the dielectric loss tangent of the non-thermoplastic polyimide layer 11 may be 0.0030 or less. The dielectric loss tangent of the non-thermoplastic polyimide layer 11 can be adjusted by, for example, changing at least one of the content ratio of each of the residues forming the non-thermoplastic polyamide acid and the maximum temperature in the imidization step. For example, the dielectric loss tangent of the multi-layered polyimide film 10 can be set to 0.004 or less by adjusting the dielectric loss tangent of the non-thermoplastic polyimide layer 11 to 0.0030 or less. The lower limit value of the dielectric loss tangent of the non-thermoplastic polyimide layer 11 is not particularly limited, and is, for example, 0.0001.

For obtaining the multi-layered polyimide film 10 which has a further reduced dielectric loss tangent while having a bond property, the adhesive layer 12 has no melting peak or has a melting heat of 1.0 J/g or less at a melting peak in the temperature range of 100° C. or higher and 420° C. or lower. Hereinafter, the melting peak in the temperature range of 100° C. or higher and 420° C. or lower may be simply referred to as a "melting peak". The method for measuring the melting heat at a melting peak is identical or similar to the method in examples described later. When the adhesive layer 12 has no melting peak or has a melting heat of 1.0 J/g or less at a melting peak, a good shape of the film containing polyamide acid in the adhesive layer forming solution can be maintained in the imidization step. Thus, a shape of the adhesive layer 12 which is suitable for bonding to the metal layer can be maintained while the dielectric loss tangent of the multi-layered polyimide film 10 is reduced by heating at a maximum temperature of 360° C. or higher in the imidization step. The melting heat of the adhesive layer 12 at a melting peak tends to decrease when imidization is performed by a chemical imidization method. The melting heat of the adhesive layer 12 at a melting peak can be adjusted by, for example, changing at least one of the content ratio of each of the residues forming the adhesive polyamide acid and the maximum temperature in the imidization step.

For obtaining the multi-layered polyimide film 10 which has a further reduced dielectric loss tangent while having a bond property, it is preferable that the adhesive layer 12 has no melting peak.

It is preferable that the adhesive layer 12 has a storage elastic modulus of 20.0 MPa or more at a temperature of 400° C. and a loss elastic modulus of 4.0 MPa or more at a temperature of 400° C. When the storage elastic modulus and the loss elastic modulus are within the above ranges, it is possible to obtain the adhesive layer 12 that can withstand heating at a high temperature. The storage elastic modulus may be 30.0 MPa or more, and the loss elastic modulus may be 5.0 MPa or more.

For obtaining the multi-layered polyimide film 10 excellent in bond property, the storage elastic modulus of the adhesive layer 12 at a temperature of 360° C. may be 1.0 GPa or less, or 0.1 GPa or less. When the storage elastic modulus of the adhesive layer 12 at a temperature of 360° C. is 1.0 GPa or less in preparation of metal-clad laminate by using the multi-layered polyimide film 10, it is possible to form the adhesive layer 12 excellent in adhesion at a preferable lamination temperature (360° C. or higher) w % ben the adhesive layer 12 and the metal foil are bonded to each other.

The method for measuring the storage elastic modulus and the loss elastic modulus of the adhesive layer 12 are identical or similar to the methods in examples described later.

Examples of the index of adhesion between the adhesive layer 12 and the metal layer include adhesion strength described in examples described later. For obtaining the multi-layered polyimide film 10 excellent in bond property, the adhesion strength described in examples described later may be 10 N/cm or more.

The non-thermoplastic polyimide layer 11 may contain components (additives) other than the non-thermoplastic polyimide. As the additive, for example, a dye, a surfactant, a leveling agent, a plasticizer, silicone, a filler, a sensitizer and the like can be used. The content ratio of the non-thermoplastic polyimide in the non-thermoplastic polyimide layer 11 may be, for example, 70 wt % or more, 80 wt % or more, 90 wt % or more, or 100 wt %, based on the total amount of the non-thermoplastic polyimide layer 11.

The adhesive layer 12 may contain components (additives) other than the polyimide. As the additive, for example, a dye, a surfactant, a leveling agent, a plasticizer, silicone, a filler, a sensitizer and the like can be used. The content ratio of the polyimide in the adhesive layer 12 may be, for example, 70 wt % or more, 80 wt % or more, 90 wt % or more, or 100 wt %, based on the total amount of the adhesive layer 12.

In each of the non-thermoplastic polyimide layer 11 and the adhesive layer 12, tertiary amine used as a catalyst is contained at a content ratio of, for example, 1 ppm by mass or more and 1000 ppm by mass or less.

Second Embodiment: Multi-Layered Polyimide Film

Next, a multi-layered polyimide film according to a second embodiment of the present invention will be described. The multi-layered polyimide film according to the second embodiment includes a non-thermoplastic polyimide layer, and an adhesive layer that is disposed on at least one surface of the non-thermoplastic polyimide layer and contains polyimide. The non-thermoplastic polyimide layer has a dielectric loss tangent of 0.0030 or less at a frequency of 10 GHz, a temperature of 23° C. and a relative humidity of 50%. The adhesive layer has no melting peak or has a melting heat of 1.0 J/g or less at a melting peak in the temperature range of 100° C. or higher and 420° C. or lower. The polyimide contained in the adhesive layer has one or more tetracarboxylic dianhydride residues selected from the group consisting of a PMDA residue and a BPDA residue and one or more diamine residues selected from the group consisting of a TPE-R residue and a m-TB residue. The multi-layered polyimide film according to the second embodiment has the above-described configuration, and consequently has a reduced dielectric loss tangent while having a bond property to a metal layer, and is excellent in productivity.

The multi-layered polyimide film according to the second embodiment can be produced by the method for producing a multi-layered polyimide film according to the first embodiment. Thus, in the following description, descriptions of contents overlapping with those of the first embodiment may be omitted. Hereinafter, matters different from those of the first embodiment will be mainly described.

In the multi-layered polyimide film according to the second embodiment, the non-thermoplastic polyimide layer is not particularly limited as long as the dielectric loss tangent is 0.0030 or less. However, in the second embodiment, it is preferable that the non-thermoplastic polyimide contained in the non-thermoplastic polyimide layer has one or more tetracarboxylic dianhydride residues selected from the group consisting of a BPDA residue and an ODPA residue and one or more diamine residues selected from the group consisting of a PDA residue and a TPE-R residue for adjusting the dielectric loss tangent to 0.0030 or less.

In the multi-layered polyimide film according to the second embodiment, the adhesive layer is not particularly limited as long as it satisfies the following conditions A and B.

Condition A: There is no melting peak or the melting heat at a melting peak is 1.0 J/g or less in the temperature range of 100° C. or higher and 420° C. or lower.

Condition B: The polyimide contained in the adhesive layer has one or more tetracarboxylic dianhydride residues selected from the group consisting of a PMDA residue and a BPDA residue and one or more diamine residues selected from the group consisting of a TPE-R residue and a m-TB residue.

However, in the second embodiment, it is preferable that the adhesive layer has a PMDA residue, a BPDA residue, a TPE-R residue and a m-TB residue for easily obtaining an adhesive layer satisfying the condition A.

In the second embodiment, it is preferable that the non-thermoplastic polyimide contained in the non-thermoplastic polyimide layer has a PDA residue and the polyimide contained in the adhesive layer has no PDA residue for easily adjusting the dielectric loss tangent of the non-thermoplastic polyimide layer to 0.0030 or less, and easily obtaining an adhesive layer satisfying the condition B.

In the second embodiment, the preferred content ratio of each residue listed above and the type of any residue other than the residues listed above are the same as the preferred content ratio of each residue of the polyamide acid and the type of any residue of the polyamide acid, respectively, in the first embodiment.

For the rest, the second embodiment is the same as described in the above section

[Multi-Layered Polyimide Film Obtained by Production Method According to First Embodiment].

Third Embodiment: Metal-Clad Laminate

Next, a metal-clad laminate according to a third embodiment of the present invention will be described with reference to the drawings. The metal-clad laminate according to the third embodiment includes a multi-layered polyimide film according to the second embodiment and a metal layer disposed on a main surface of at least one of the adhesive layers of the multi-layered polyimide film. The metal-clad laminate according to the third embodiment can be produced by using the multi-layered polyimide film according to the second embodiment as a material. Thus, in the following description, descriptions of contents overlapping with those of the first embodiment and the second embodiment may be omitted.

Figure 2:
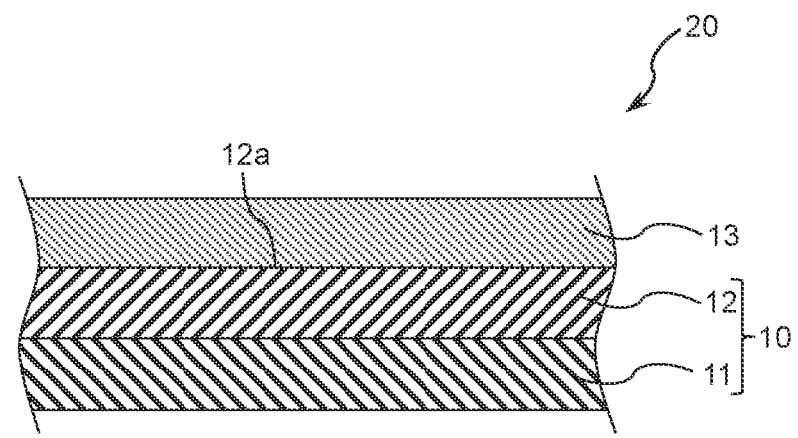
FIG. 2 is a sectional view showing an example of a metal-clad laminate according to one or more embodiments of the present invention.

FIG. 2 is a sectional view showing an example of the metal-clad laminate according to the third embodiment. As shown in FIG. 2, a metal-clad laminate 20 has a multi-layered polyimide film 10 and a metal layer 13 (metal foil) disposed on a main surface 12a of an adhesive layer 12 of the multi-layered polyimide film 10.

[Method for Producing Metal-Clad Laminate According to Third Embodiment]

When the metal-clad laminate 20 is produced by using the multi-layered polyimide film 10, a metal foil as the metal layer 13 is bonded to at least one surface of the multi-layered polyimide film 10 (for example, in a case of FIG. 2, main surface 12a of adhesive layer 12 on a side opposite to non-thermoplastic polyimide layer 11 side). In this way, the metal-clad laminate 20 shown in FIG. 2 is obtained. The method for bonding a metal foil to the main surface 12a of the adhesive layer 12 is not particularly limited, and various known methods can be adopted. It is possible to adopt, for example, a continuous processing method using a hot-roll lamination apparatus having one or more pairs of metal rolls, or a double belt press (DBP). The specific configuration of the means for carrying out the hot-roll lamination is not particularly limited, and it is preferable to dispose a protective material between the pressed surface and the metal foil for improving the appearance of the metal-clad laminate 20 obtained.

When the adhesive layer 12 is provided on each of both surfaces of the non-thermoplastic polyimide layer 11, a double-sided metal-clad laminate (not shown) is obtained by bonding a metal foil to each of both surfaces (both main surfaces) of the multi-layered polyimide film 10.

The metal foil as the metal layer 13 is not particularly limited, and any metal foil can be used. For example, a metal foil made of any of materials such as copper, stainless steel, nickel, aluminum and alloys of these metals is suitably used. In general metal-clad laminates, a copper foil such as a rolled copper foil or an electrolytic copper foil is often used, and in the third embodiment, a copper foil may be used.

As the metal foil, one subjected to surface treatment or the like to adjust surface roughness or the like according to a purpose can be used. Further, a rustproof layer, a heat resistant layer, an adhesive layer, and the like may be formed on the surface of the metal foil. The thickness of the metal foil is not particularly limited, and may a thickness that allows a sufficient function to be exhibited according to a use purpose. For easily reducing the thickness of FPC while suppressing generation of creases in bonding to the multi-layered polyimide film 10, the thickness of the metal foil may be 5 μm or more and 50 μm or less.

EXAMPLES

Hereinafter, one or more embodiments of the present invention will be described in more detail by way of examples, but one or more embodiments of the present invention are not limited to these examples.

<Method for Measuring and Evaluating Physical Properties>

[Film Formability]

An imidization accelerator including acetic anhydride, isoquinoline and DMF (weight ratio: acetic anhydride/isoquinoline/DMF=3.0/1.2/4.4) was added to a polyamide acid solution (specifically, any of polyamide acid solutions P4 to P13 described later) to obtain an adhesive layer forming solution. The added amount of the imidization accelerator was 50 parts by weight based on 100 parts by weight of the polyamide acid solution. The obtained adhesive layer forming solution was extruded from a T-die of a film forming apparatus while being stirred with a mixer, and cast and applied onto a stainless steel endless belt to form a coating film. The obtained coating film was dried at a temperature of 130° C. for 100 seconds, and the obtained gel film was then peeled off from the endless belt and fixed to a tenter clip. The gel film was heated at a temperature of 250° C. for 17 seconds, and then heated at a temperature of 300° C. for 137 seconds to imidize the polyamide acid in the gel film. In this imidization step, it was determined that "film formation was possible" when a single-layered film including a 17 μm-thick adhesive layer was obtained, and it was determined that "film formation was impossible" when it was not possible to form a film because defects such as creases and cracks were generated.

[Melting Temperature and Melting Heat of Adhesive Layer]

A measurement sample (mass: 8 mg) obtained by sampling an adhesive layer of a multi-layered polyimide film obtained in each of examples and comparative examples described later was used. A melting temperature and a melting heat were measured by a differential scanning calorimeter ("DSC 220" manufactured by Seiko Instruments Inc.). Specifically, the measurement sample was put in an aluminum dish (aluminum container), and the aluminum dish was set in a measuring section of the differential scanning calorimeter. An empty aluminum dish was used as a reference. The atmospheric temperature was elevated from 0° C. to 450° C. at a temperature elevation rate of 10° C./min, and then lowered from 450° C. to 0° C. at a temperature lowering rate of 40° C./min. The atmospheric temperature was then elevated from 0° C. to 450° C. at a temperature elevation rate of 10° C./min again. The temperature at a peak of an endotherm chart in the second temperature elevation was taken as a melting temperature. The melting heat (unit: J/g) was determined from the area of the peak of the endotherm chart. When there was no melting peak in the temperature range of 100° C. or higher and 420° C. or lower in the endotherm chart, i.e. the adhesive layer to be measured had no melting peak in the temperature range of 100° C. or higher and 420° C. or lower, the melting heat was defined as 0 J/g.

[Storage Modulus (E') and Loss Modulus (E") of Adhesive Layer]

A single-layered film obtained in the same procedure as that for the single-layered film obtained in the evaluation in [Film formability] described above was used as a measurement sample. E' and E" were measured by a dynamic viscoelasticity measuring apparatus ("DM 6100" manufactured by Hitachi High-Tech Science Corporation). Specifically, the dynamic viscoelasticity of the sample was measured by the dynamic viscoelasticity measuring apparatus under an air atmosphere, a graph with E' and E" plotted against the measurement temperature was prepared, and E' at each of temperatures of 360° C. and 400° C. and E" at a temperature of 400° C. were read from the graph. The measurement conditions are shown below.

Sample width: 9 mm
Distance between sample holding tools (grippers): 20 mm
Measurement temperature range: 0° C. to 440° C.
Temperature elevation rate: 3° C./min
Strain amplitude: 10 μm
Measurement frequency: 5 Hz
Minimum tension/compression force: 100 mN
Tension/compression gain: 1.5
Initial force amplitude value: 100 mN

[Content Ratio of Tertiary Amine]

Using a measurement sample (mass: 0.5 mg) obtained by sampling each layer (specifically, each of the adhesive layer and the non-thermoplastic polyimide layer) of a multi-layered polyimide film obtained in each of examples and comparative examples described later, the content ratio of tertiary amine in each layer was measured under the condition of a heating temperature of 350° C. by a pyrolysis gas chromatograph/mass spectrometer ("Py-GC/MS" manufactured by Agilent Technologies Inc.).

[Dielectric Loss Tangent]

Each of a single-layered film (adhesive layer) obtained in the same procedure as that for the single-layered film obtained in the evaluation in [Film formability] described above, a non-thermoplastic polyimide layer, and a multi-layered polyimide film (all layers) obtained in each of examples and comparative examples described later was used as a measurement sample. The dielectric loss tangent was measured by a network analyzer ("N5224B" manufactured by Keysight Technologies) and a cavity resonator perturbation dielectric constant measurement apparatus ("CP531" manufactured by EM labs, Inc.). Specifically, the sample was left standing in an atmosphere at a temperature of 23° C. and a relative humidity of 50% for 24 hours, and the dielectric loss tangent was then measured under the conditions of a temperature of 23° C., a relative humidity of 50% and a measurement frequency of 10 GHz by using the network analyzer and the cavity resonator perturbation dielectric constant measurement apparatus. When the dielectric loss tangent of the multi-layered polyimide film (all layers) was 0.0040 or less, it was evaluated that "the dielectric loss tangent was reduced". On the other hand, when the dielectric loss tangent of the multi-layered polyimide film (all layers) was more than 0.0040, it was evaluated that "the dielectric loss tangent was not reduced". For the non-thermoplastic polyimide layer, a single-layered film including a non-thermoplastic polyimide layer obtained by scraping each of the adhesive layers on both surfaces of a multi-layered polyimide film obtained in each of examples and comparative examples described later with sandpaper (#600) was used as a measurement sample.

[Adhesion]

A 12 μm-thick electrolytic copper foil ("CF-T49A-HD2" manufactured by Fukuda Metal Foil & Powder Co., Ltd.) was disposed on each of both surfaces of a multi-layered polyimide film (any of the multi-layered polyimide films obtained in examples and comparative examples described later), and a protective film ("APICAL (registered trademark) 125NPI" manufactured by KANEKA CORPORATION, thickness: 125 μm) was disposed on the outer surface of each electrolytic copper foil. In this state, lamination was performed with a hot roll laminator under the conditions of a lamination temperature of 360° C., a lamination pressure of 314 N/cm (32 kgf/cm) and a lamination speed of 1.0 m/min to obtain a flexible copper-clad laminate. The obtained flexible copper-clad laminate was analyzed in accordance with JIS C6471-1995, "6.5 Peel Strength". Specifically, one electrolytic copper foil of each flexible copper-clad laminate was peeled off under the conditions of a peel angle of 90°, a tensile speed of 100 mm/min and a measurement width of 1 mm, and the load (unit: N/cm) was taken as adhesion strength. When the adhesion strength was 10 N/cm or more, it was evaluated that "the sample was excellent in adhesion". When the adhesion strength was less than 10 N/cm, it was evaluated that "the sample was not excellent in adhesion".

[Embeddability]

A copper foil of a flexible copper-clad laminate obtained in the same procedure as that for the flexible copper-clad laminate obtained in the evaluation in [Adhesion] described above was completely removed by etching treatment. The exposed surface of the multi-layered polyimide film was observed under the condition of a magnification of 20 times by using an optical microscope. When the matte surface of the copper foil was uniformly transferred to the surface of the multi-layered polyimide film, it was evaluated that the sample was "excellent in embeddability (A)" On the other hand, when the matte surface of the copper foil was not uniformly transferred to the surface of the multi-layered polyimide film, it was evaluated that the sample was "not excellent in embeddability (B)"

When the adhesion strength was 10 N/cm or more and A was assigned in the evaluation of embeddability, it was evaluated that "a bond property to the metal layer was secured". On the other hand, when the adhesion strength was less than 10 N/cm or B was assigned in the evaluation of embeddability, it was evaluated that "a bond property to the metal layer was not secured".

<Preparation of Polyamide Acid Solution>

Hereinafter, a method for preparing polyamide acid solutions P1 to P13 will be described. The polyamide acid solutions P1 to P13 were each prepared in a nitrogen atmosphere at a temperature of 20° C.

[Preparation of Polyamide Acid Solution P1]

1477.48 kg of DMF, 27.28 kg of TPE-R and 57.24 kg of PDA were put in a reaction tank, 109.93 kg of BPDA was then put therein, and the reaction tank contents were stirred. BPDA was visually confirmed to have been dissolved, and 71.48 kg of ODPA was then put in the reaction tank while the reaction tank contents were stirred. The reaction tank contents were stirred for 30 minutes. Subsequently, while the reaction tank contents were stirred, a PMDA solution prepared in advance (solvent: DMF, dissolved amount of PMDA: 4.08 kg, concentration of PMDA: 7.2 wt %) was continuously added to the reaction tank for a predetermined time at an addition rate which did not cause the viscosity of the reaction tank contents to rapidly increase. At the time when the viscosity of the reaction tank contents at a temperature of 23° C. reached 2000 poise, the addition of the PMDA solution and the stirring of the reaction tank contents were stopped to obtain the polyamide acid solution P1.

The polyimide obtained from the polyamide acid in the obtained polyamide acid solution P1 was confirmed to be non-thermoplastic by the method shown below. 40 parts by weight of an imidization accelerator including acetic anhydride, isoquinoline and DMF (weight ratio: acetic anhydride/isoquinoline/DMF=101/51/48) was added to 100 parts by mass of the polyamide acid solution P1 to prepare a non-thermoplastic polyimide layer forming solution. The obtained non-thermoplastic polyimide layer forming solution was then extruded from a T-die of a film forming apparatus while being stirred with a mixer, and cast and applied onto a stainless steel endless belt to form a coating film. The obtained coating film was dried at a temperature of 100° C. for 380 seconds, and the obtained gel film was then peeled off from the endless belt and fixed to a tenter clip. The gel film was heated at a temperature of 300° C. for 110 seconds, and then heated at a temperature of 380° C. for 97 seconds to imidize the polyamide acid in the gel film, thereby obtaining a 34 μm-thick polyimide film. The obtained polyimide film was fixed to a metallic fixation frame and heated at a heating temperature of 380° C. for 2 minutes, and the shape of the polyimide film (film shape) was still retained. Thus, the polyimide obtained from the polyamide acid in the polyamide acid solution P1 was non-thermoplastic polyimide. For polyamide acid solutions P2 and P3 prepared by methods shown below, the same method as the method for forming a film using the polyamide acid solution P1 was carried out to fix the obtained polyimide film to a metallic fixation frame and heat the film at a heating temperature of 380° C. for 2 minutes, and the shape of the polyimide film (film shape) was still retained. Thus, the polyimide obtained from the polyamide acid in each of the polyamide acid solutions P2 and P3 was non-thermoplastic polyimide.

[Preparation of Polyamide Acid Solution P2]

1404.80 kg of DMF, 27.87 kg of TPE-R and 58.48 kg of PDA were put in a reaction tank, 112.31 kg of BPDA was then put therein, and the reaction tank contents were stirred. BPDA was visually confirmed to have been dissolved, and 65.13 kg of ODPA was then put in the reaction tank while the reaction tank contents were stirred. The reaction tank contents were stirred for 30 minutes. Subsequently, while the reaction tank contents were stirred, a PMDA solution prepared in advance (solvent: DMF, dissolved amount of PMDA: 9.71 kg, concentration of PMDA: 7.2 wt %) was continuously added to the reaction tank for a predetermined time at an addition rate which did not cause the viscosity of the reaction tank contents to rapidly increase. At the time when the viscosity of the reaction tank contents at a temperature of 23° C. reached 2000 poise, the addition of the PMDA solution and the stirring of the reaction tank contents were stopped to obtain the polyamide acid solution P2.

[Preparation of Polyamide Acid Solution P3]

1480.09 kg of DMF, 23.70 kg of 4,4'-diaminodiphenyl ether (hereinafter, sometimes referred as "ODA") and 72.89 kg of 2,2-bis[4-(4-aminophenoxy)phenyl]propane (hereinafter, sometimes referred to as "BAPP") were put in a reaction tank, and the reaction tank contents were then stirred. Each monomer was visually confirmed to have been dissolved, and 38.14 kg of 3,3',4,4'-benzophenone tetracarboxylic dianhydride (hereinafter, sometimes referred to as "BTDA") and 32.27 kg of PMDA were then put in the reaction tank while the reaction tank contents were stirred. The reaction tank contents were stirred for 30 minutes. 32.00 kg of PDA was then put in the reaction tank while the reaction tank contents were stirred, and 67.13 kg of PMDA was then put therein. The reaction tank contents were stirred for 30 minutes. Subsequently, while the reaction tank contents were stirred, a PMDA solution prepared in advance (solvent: DMF, dissolved amount of PMDA: 3.87 kg, concentration of PMDA: 7.2 wt %) was continuously added to the reaction tank for a predetermined time at an addition rate which did not cause the viscosity of the reaction tank contents to rapidly increase. At the time when the viscosity of the reaction tank contents at a temperature of 23° C. reached 2000 poise, the addition of the PMDA solution and the stirring of the reaction tank contents were stopped to obtain the polyamide acid solution P3.

[Preparation of Polyamide Acid Solution P4]

1507.46 kg of DMF, 98.25 kg of TPE-R and 70.71 kg of BPDA were put in a reaction tank, and the reaction tank contents were then stirred for 30 minutes. 15.73 kg of PMDA was put in the reaction tank while the reaction tank contents were stirred. The reaction tank contents were then stirred for 30 minutes. 30.61 kg of m-TB and 33.55 kg of PMDA were then put in the reaction tank while the reaction tank contents were stirred. The reaction tank contents were then stirred for 30 minutes. Subsequently, while the reaction tank contents were stirred, a PMDA solution prepared in advance (solvent: DMF, dissolved amount of PMDA: 3.15 kg, concentration of PMDA: 7.2 wt %) was continuously added to the reaction tank for a predetermined time at an addition rate which did not cause the viscosity of the reaction tank contents to rapidly increase. At the time when the viscosity of the reaction tank contents at a temperature of 23° C. reached 1000 poise, the addition of the PMDA solution and the stirring of the reaction tank contents were stopped to obtain the polyamide acid solution P4.

[Preparation of Polyamide Acid Solution P5]

1508.32 kg of DMF, 96.16 kg of TPE-R and 89.97 kg of BPDA were put in a reaction tank, and the reaction tank contents were then stirred for 30 minutes. 29.96 kg of m-TB and 32.84 kg of PMDA were then put in the reaction tank while the reaction tank contents were stirred. The reaction tank contents were then stirred for 30 minutes. Subsequently, while the reaction tank contents were stirred, a PMDA solution prepared in advance (solvent: DMF, dissolved amount of PMDA: 3.08 kg, concentration of PMDA: 7.2 wt %) was continuously added to the reaction tank for a predetermined time at an addition rate which did not cause the viscosity of the reaction tank contents to rapidly increase. At the time when the viscosity of the reaction tank contents at a temperature of 23° C. reached 1000 poise, the addition of the PMDA solution and the stirring of the reaction tank contents were stopped to obtain the polyamide acid solution P5.

[Preparation of Polyamide Acid Solution P6]

1506.86 kg of DMF, 99.70 kg of TPE-R and 57.40 kg of BPDA were put in a reaction tank, and the reaction tank contents were then stirred for 30 minutes. 26.60 kg of PMDA was put in the reaction tank while the reaction tank contents were stirred. The reaction tank contents were then stirred for 30 minutes. 31.06 kg of m-TB and 34.04 kg of PMDA were then put in the reaction tank while the reaction tank contents were stirred. The reaction tank contents were then stirred for 30 minutes. Subsequently, while the reaction tank contents were stirred, a PMDA solution prepared in advance (solvent: DMF, dissolved amount of PMDA: 3.19 kg, concentration of PMDA: 7.2 wt %) was continuously added to the reaction tank for a predetermined time at an addition rate which did not cause the viscosity of the reaction tank contents to rapidly increase. At the time when the viscosity of the reaction tank contents at a temperature of 23° C. reached 1000 poise, the addition of the PMDA solution and the stirring of the reaction tank contents were stopped to obtain the polyamide acid solution P6.

[Preparation of Polyamide Acid Solution P7]

1541.34 kg of DMF, 91.60 kg of TPE-R and 131.86 kg of BPDA were put in a reaction tank, and the reaction tank contents were then stirred for 30 minutes. 25.69 kg of m-TB was put in the reaction tank while the reaction tank contents were stirred. The reaction tank contents were then stirred for 30 minutes. Subsequently, while the reaction tank contents were stirred, a m-TB solution prepared in advance (solvent: DMF, dissolved amount of m-TB: 2.85 kg, concentration of m-TB: 30 wt %) was continuously added to the reaction tank for a predetermined time at an addition rate which did not cause the viscosity of the reaction tank contents to rapidly increase. At the time when the viscosity of the reaction tank contents at a temperature of 23° C. reached 1000 poise, the addition of the m-TB solution and the stirring of the reaction tank contents were stopped to obtain the polyamide acid solution P7.

[Preparation of Polyamide Acid Solution P8]

1541.39 kg of DMF, 97.45 kg of TPE-R and 130.93 kg of BPDA were put in a reaction tank, and the reaction tank contents were then stirred for 30 minutes. 20.78 kg of m-TB was put in the reaction tank while the reaction tank contents were stirred. The reaction tank contents were then stirred for 30 minutes. Subsequently, while the reaction tank contents were stirred, a m-TB solution prepared in advance (solvent: DMF, dissolved amount of m-TB: 2.83 kg, concentration of m-TB: 30 wt %) was continuously added to the reaction tank for a predetermined time at an addition rate which did not cause the viscosity of the reaction tank contents to rapidly increase. At the time when the viscosity of the reaction tank contents at a temperature of 23° C. reached 1000 poise, the addition of the m-TB solution and the stirring of the reaction tank contents were stopped to obtain the polyamide acid solution P8.

[Preparation of Polyamide Acid Solution P9]

1541.84 kg of DMF, 96.99 kg of TPE-R and 139.61 kg of BPDA were put in a reaction tank, and the reaction tank contents were then stirred for 30 minutes. 13.85 kg of PDA was put in the reaction tank while the reaction tank contents were stirred. The reaction tank contents were then stirred for 30 minutes. Subsequently, while the reaction tank contents were stirred, a PDA solution prepared in advance (solvent: DMF, dissolved amount of PDA: 1.54 kg, concentration of PDA: 20 wt %) was continuously added to the reaction tank for a predetermined time at an addition rate which did not cause the viscosity of the reaction tank contents to rapidly increase. At the time when the viscosity of the reaction tank contents at a temperature of 23° C. reached 1000 poise, the addition of the PDA solution and the stirring of the reaction tank contents were stopped to obtain the polyamide acid solution P9.

[Preparation of Polyamide Acid Solution P10]

1540.30 kg of DMF, 105.94 kg of TPE-R and 113.05 kg of PMDA were put in a reaction tank, and the reaction tank contents were then stirred for 30 minutes. 29.71 kg of m-TB was put in the reaction tank while the reaction tank contents were stirred. The reaction tank contents were then stirred for 30 minutes. Subsequently, while the reaction tank contents were stirred, a m-TB solution prepared in advance (solvent: DMF, dissolved amount of m-TB: 3.30 kg, concentration of m-TB: 30 wt %) was continuously added to the reaction tank for a predetermined time at an addition rate which did not cause the viscosity of the reaction tank contents to rapidly increase. At the time when the viscosity of the reaction tank contents at a temperature of 23° C. reached 1000 poise, the addition of the m-TB solution and the stirring of the reaction tank contents were stopped to obtain the polyamide acid solution P10.

[Preparation of Polyamide Acid Solution P11]

1509.23 kg of DMF, 134.24 kg of TPE-R and 67.63 kg of BPDA were put in a reaction tank, and the reaction tank contents were then stirred for 30 minutes. 47.13 kg of PMDA was put in the reaction tank while the reaction tank contents were stirred. The reaction tank contents were then stirred for 30 minutes. Subsequently, while the reaction tank contents were stirred, a PMDA solution prepared in advance (solvent: DMF, dissolved amount of PMDA: 3.01 kg, concentration of PMDA: 7.2 wt %) was continuously added to the reaction tank for a predetermined time at an addition rate which did not cause the viscosity of the reaction tank contents to rapidly increase. At the time when the viscosity of the reaction tank contents at a temperature of 23° C. reached 1000 poise, the addition of the PMDA solution and the stirring of the reaction tank contents were stopped to obtain the polyamide acid solution P11.

[Preparation of Polyamide Acid Solution P12]

1514.99 kg of DMF, 160.67 kg of BAPP and 23.03 kg of BPDA were put in a reaction tank, and the reaction tank contents were then stirred for 30 minutes. 65.73 kg of PMDA was put in the reaction tank while the reaction tank contents were stirred. The reaction tank contents were then stirred for 30 minutes. Subsequently, while the reaction tank contents were stirred, a PMDA solution prepared in advance (solvent: DMF, dissolved amount of PMDA: 2.56 kg, concentration of PMDA: 7.2 wt %) was continuously added to the reaction tank for a predetermined time at an addition rate which did not cause the viscosity of the reaction tank contents to rapidly increase. At the time when the viscosity of the reaction tank contents at a temperature of 23° C. reached 1000 poise, the addition of the PMDA solution and the stirring of the reaction tank contents were stopped to obtain the polyamide acid solution P12.

[Preparation of Polyamide Acid Solution P13]

1510.01 kg of DMF, 124.96 kg of TPE-R and 92.78 kg of BPDA were put in a reaction tank, and the reaction tank contents were then stirred for 30 minutes. 4.78 kg of m-TB and 26.53 kg of PMDA were then put in the reaction tank while the reaction tank contents were stirred. The reaction tank contents were then stirred for 30 minutes. Subsequently, while the reaction tank contents were stirred, a PMDA solution prepared in advance (solvent: DMF, dissolved amount of PMDA: 2.95 kg, concentration of PMDA: 7.2 wt %) was continuously added to the reaction tank for a predetermined time at an addition rate which did not cause the viscosity of the reaction tank contents to rapidly increase. At the time when the viscosity of the reaction tank contents at a temperature of 23° C. reached 1000 poise, the addition of the PMDA solution and the stirring of the reaction tank contents were stopped to obtain the polyamide acid solution P13.

Table 1 shows the materials used for the polyamide acid solutions P1 to P13 and the ratios thereof. The molar fraction of each residue in the polyamide acid contained in each of the polyamide acid solutions P1 to P13 was consistent with the molar fraction of each monomer (diamine and tetracarboxylic dianhydride) used. Table 2 shows the results of performing measurement and evaluation by the above-described methods for the single-layered film obtained by using each of the polyamide acid solutions P4 to P13. In Table 1, "-" means that the relevant component was not used. In Table 1, the numerical value given in the column of "acid dianhydride" is the content ratio (unit: mol %) of each acid dianhydride to the total amount of acid dianhydrides used. In Table 1, the numerical value given in the column of "diamine" is the content ratio (unit: mol %) of each diamine to the total amount of diamine used. In Table 2, "-" means that measurement was not performed.

TABLE 1

| Polyamide acid | Diamine [mol %] | | | | | Acid dianhydride [mol %] | | | |
|---|---|---|---|---|---|---|---|---|---|
| solution | TPE-R | PDA | m-TB | BAPP | ODA | PMDA | BPDA | ODPA | BTDA |
| P1 | 15 | 85 | — | — | — | 3 | 60 | 37 | — |
| P2 | 12 | 88 | — | — | — | 7 | 60 | 33 | — |
| P3 | — | 50 | — | 30 | 20 | 80 | — | — | 20 |
| P4 | 70 | — | 30 | — | — | 50 | 50 | — | — |
| P5 | 70 | — | 30 | — | — | 35 | 65 | — | — |
| P6 | 70 | — | 30 | — | — | 60 | 40 | — | — |
| P7 | 70 | — | 30 | — | — | — | 100 | — | — |
| P8 | 75 | — | 25 | — | — | — | 100 | — | — |
| P9 | 70 | 30 | — | — | — | — | 100 | — | — |
| P10 | 70 | — | 30 | — | — | 100 | — | — | — |
| P11 | 100 | — | — | — | — | 50 | 50 | — | — |
| P12 | — | — | — | 100 | — | 80 | 20 | — | — |
| P13 | 95 | — | 5 | — | — | 30 | 70 | — | — |

TABLE 2

| Polyamide acid solution | Film formability | E' at temperature of 360° C. [GPa] | E' at temperature of 400° C. [MPa] | E" at temperature of 400° C. [MPa] |
|---|---|---|---|---|
| P4 | Film formation possible | 0.06 | 32.0 | 5.4 |
| P5 | Film formation possible | 0.06 | 25.0 | 6.3 |
| P6 | Film formation possible | 0.10 | 47.0 | 9.6 |
| P7 | Film formation possible | 0.10 | 15.0 | 3.4 |
| P8 | Film formation possible | 0.07 | 1.2 | 2.6 |
| P9 | Film formation possible | 0.12 | 16.0 | 3.6 |
| P10 | Film formation impossible | — | — | — |
| P11 | Film formation impossible | — | — | — |
| P12 | Film formation possible | 0.04 | 5.3 | 1.9 |
| P13 | Film formation possible | 0.03 | 36.6 | 6.1 |

<Preparation of Multi-Layered Polyimide Film>

Hereinafter, methods for producing a multi-layered polyimide film in each of Examples 1 to 5 and Comparative Examples 1 to 5 will be described.

Example 11

A mixture of 144 kg of DMF, 153 kg of isoquinoline and 303 kg of acetic anhydride was prepared as an imidization accelerator. The imidization accelerator was added to the polyamide acid solution P1, and the mixture was stirred with a mixer to obtain a non-thermoplastic polyimide layer forming solution. The added amount of the imidization accelerator was 40 parts by weight based on 100 parts by weight of the polyamide acid solution P1. The polyamide acid solution P4 was provided as an adhesive layer forming solution.

Subsequently, by using an extraction molding machine having an extraction molding die of three layers, the non-thermoplastic polyimide layer forming solution and the adhesive layer forming solution were applied onto a stainless steel endless belt as a support by a coextrusion-casting application method. Specifically, first, the non-thermoplastic polyimide layer forming solution was supplied to the center layer of the extrusion molding die, and the adhesive layer forming solution was supplied to the two layers (on both sides) each adjacent to the central layer of the extrusion molding die. The opening width of a lip opening portion of the extrusion molding die (the length of the lip opening portion in the short direction) was adjusted to 1.3 mm. The non-thermoplastic polyimide layer forming solution and the adhesive layer forming solution were extruded from the lip opening portion of the extrusion molding die by a coextrusion-casting application method to form a coating film (coating film including three layers of adhesive layer forming solution/non-thermoplastic polyimide layer forming solution/adhesive layer forming solution) on the stainless steel endless belt. The obtained coating film was dried on a stainless steel endless belt at a temperature of 100° C. for 380 seconds to obtain a gel film. The gel film was peeled off from the stainless steel endless belt, then fixed at both ends in the long direction with pins, and heated at a temperature of 300° C. for 110 seconds, and then at a temperature (maximum temperature) of 380° C. for 97 seconds to imidize the polyamide acid in the non-thermoplastic polyimide layer forming solution and the adhesive layer forming solution, thereby obtaining a multi-layered polyimide film of Example 1. The multi-layered polyimide film of Example 1 had a three-layer structure of adhesive layer/non-thermoplastic polyimide layer/adhesive layer, and had a thicknesses of adhesive layer/non-thermoplastic polyimide layer/adhesive layer of 8 μm/34 μm/8 μm.

Using a measurement sample (mass: 0.5 mg) obtained by sampling each of the adhesive layer and the non-thermoplastic polyimide layer of the multi-layered polyimide film of Example 1, the content ratio of tertiary amine (isoquinoline) in each of the layers was measured by the above-described method, and the results showed that isoquinoline was detected at a content ratio of 1 ppm by mass or more for both the adhesive layer and the non-thermoplastic polyimide layer. For Examples 2 to 5 and Comparative Examples 1 to 5 described below, the content ratio of tertiary amine (isoquinoline) in each of the layers was measured by the same method as in Example 1, and the results showed that isoquinoline was detected at a content ratio of 1 ppm by mass or more for both the adhesive layer and the non-thermoplastic polyimide layer.

Examples 2 to 5 and Comparative Examples 1 to 5

A multi-layered polyimide film of each of Examples 2 to 5 and Comparative Examples 1 to 5 was obtained by the same method as in Example 1 except that the type of the polyamide acid solution for preparing the non-thermoplastic polyimide layer forming solution and the type of the polyamide acid solution used as the adhesive layer forming solution were as shown in Table 3 described later.

<Attempts to Prepare Multi-Layered Polyimide Film>

Comparative Example 6

An attempt was made to obtain a multi-layered polyimide film by the same method as in Example 1 except that as an adhesive layer forming solution, the polyamide acid solution P10 was used instead of the polyamide acid solution P4, but cracks were generated in the film, so that a good film was not obtained.

Comparative Example 7

An attempt was made to obtain a multi-layered polyimide film by the same method as in Example 1 except that as an adhesive layer forming solution, the polyamide acid solution P11 was used instead of the polyamide acid solution P4, but cracks were generated in the film, so that a good film was not obtained.

Comparative Example 8

An attempt was made to obtain a multi-layered polyimide film by the same method as in Example 1 except that the polyamide acid solution Pt was used as a non-thermoplastic polyimide layer forming solution without adding an imidization accelerator to the polyamide acid solution P1, but creases were generated in the film, so that a good film was not obtained. Using a measurement sample (mass: 0.5 mg) obtained by sampling a portion of a film surface (adhesive layer) where there were no creases, the content ratio of tertiary amine was measured by the above-described method, and the results showed that tertiary amine was not detected. That is, in Comparative Example 8, the content ratio of the tertiary amine in the adhesive layer was below the lower limit of detection (1 ppm by mass). Using a measurement sample (mass: 8 mg) obtained by sampling a portion of a film surface (adhesive layer) where there were no creases, the melting temperature and the melting heat were measured by the above-described methods, the results showed that the melting temperature and the melting heat were 333° C. and 2.3 J/g, respectively.

<Preparation of Polyimide Film of Reference Example>

As a reference example, a single-layered polyimide film was prepared. In the preparation of the polyimide film of the reference example, the polyamide acid solution P4 was used as a dope solution without adding an imidization accelerator to the polyamide acid solution P4. First, by using Comma Coater (registered trademark), the polyamide acid solution P4 was applied to one surface of a 12 μm-thick electrolytic copper foil ("CF-T49A-HD2" manufactured by Fukuda Metal Foil & Powder Co., Ltd.) to form a coating film. The coating film was dried at a temperature of 130° C. for 120 seconds to obtain a gel film. The obtained gel film was heated at a temperature of 120° C. for 5 minutes, then heated to 350° C. at a temperature elevation rate of 5° C./min, and heated at a temperature of 350° C. for 30 minutes to imidize the polyamide acid in the coating film, thereby obtaining a 12 µm-thick polyimide film. Using a measurement sample (mass: 0.5 mg) obtained by sampling the polyimide film of the reference example, the content ratio of tertiary amine was measured by the above-described method, and the results showed that tertiary amine was not detected. That is, in the reference example, the content ratio of the tertiary amine in the polyimide film was below the lower limit of detection (1 ppm by mass). Using a measurement sample (mass: 8 mg) obtained by sampling the polyimide film of the reference example, the melting temperature and the melting heat were measured by the above-described methods, the results showed that the melting temperature and the melting heat were 333° C. and 2.3 J/g, respectively.

<Evaluation Results>

Table 3 shows the type of the polyamide acid solution for preparing a non-thermoplastic polyimide layer forming solution, the type of the polyamide acid solution used as an adhesive layer forming solution, the melting temperature of the adhesive layer and the melting heat of the adhesive layer for Examples 1 to 5 and Comparative Examples 1 to 5. Table 4 shows the adhesion strength, embeddability and dielectric loss tangent for Examples 1 to 5 and Comparative Examples 1 to 5. In Table 3, the "non-thermoplastic solution" means a polyamide acid solution for preparing a non-thermoplastic polyimide layer forming solution. In Table 3, the "adhesive solution" means a polyamide acid solution used as an adhesive layer forming solution. In Table 3, the "no peak-" means that there was no melting peak in the temperature range of 100° C. or higher and 420° C. or lower.

TABLE 3

| | Type of non-thermoplastic solution | Type of adhesive solution | Adhesive layer | |
|---|---|---|---|---|
| | | | Melting temperature [° C.] | Melting heat [J/g] |
| Example 1 | P1 | P4 | No peak | 0 |
| Example 2 | P2 | P4 | No peak | 0 |
| Example 3 | P1 | P5 | No peak | 0 |
| Example 4 | P1 | P6 | No peak | 0 |
| Example 5 | P2 | P13 | No peak | 0 |
| Comparative Example 1 | P1 | P7 | 388 | 18 |
| Comparative Example 2 | P1 | P8 | 386 | 14 |
| Comparative Example 3 | P1 | P9 | 384 | 26 |
| Comparative Example 4 | P1 | P12 | 316 | 7 |
| Comparative Example 5 | P3 | P4 | No peak | 0 |

TABLE 4

| | Adhesion strength [N/cm] | Embeddability | Dielectric loss tangent | | |
|---|---|---|---|---|---|
| | | | Non-thermoplastic polyimide layer | Adhesive layer | All layers |
| Example 1 | 11 | A | 0.0027 | 0.0034 | 0.0029 |
| Example 2 | 11 | A | 0.0027 | 0.0034 | 0.0029 |
| Example 3 | 10 | A | 0.0027 | 0.0034 | 0.0029 |
| Example 4 | 10 | A | 0.0027 | 0.0036 | 0.0030 |
| Example 5 | 11 | A | 0.0027 | 0.0034 | 0.0029 |
| Comparative Example 1 | 4 | B | 0.0027 | 0.0039 | 0.0031 |
| Comparative Example 2 | 4 | B | 0.0027 | 0.0034 | 0.0030 |
| Comparative Example 3 | 4 | B | 0.0027 | 0.0043 | 0.0032 |
| Comparative Example 4 | 2 | A | 0.0027 | 0.0060 | 0.0038 |
| Comparative Example 5 | 12 | A | 0.0140 | 0.0034 | 0.0104 |

The polyamide acid contained in the adhesive layer forming solution used in preparation of the multi-layered polyimide film of each of Examples 1 to 5 had a PMDA residue, a BPDA residue, a TPE-R residue and an m-TB residue. The polyamide acid contained in the non-thermoplastic polyimide layer forming solution used in preparation of the multi-layered polyimide film of each of Examples 1 to 5 had one or more tetracarboxylic dianhydride residues selected from the group consisting of a BPDA residue and an ODPA residue and one or more diamine residues selected from the group consisting of a PDA residue and a TPE-R residue. The dielectric loss tangent of the non-thermoplastic polyimide layer of the multi-layered polyimide film of each of Examples 1 to 5 was 0.0030 or less. The adhesive layer of the multi-layered polyimide film of each of Examples 1 to 5 had no melting peak in the temperature range of 100° C. or higher and 420° C. or lower.

In the multi-layered polyimide films of Examples 1 to 5, the adhesion strength was 10 N/cm or more. Thus, the multi-layered polyimide films of Examples 1 to 5 were excellent in adhesion. The multi-layered polyimide films of Examples 1 to 5 were rated A for embeddability. Thus, the multi-layered polyimide films of Examples 1 to 5 were excellent in embeddability. In the multi-layered polyimide films of Examples 1 to 5, all layers had a dielectric loss tangent of 0.0040 or less. Thus, the multi-layered polyimide films of Examples 1 to 5 had a reduced dielectric loss tangent.

The polyamide acid contained in the adhesive layer forming solution used in preparation of the multi-layered polyimide film of each of Comparative Examples 1 to 3 had no PMDA residue. The polyamide acid contained in the adhesive layer forming solution used in preparation of the multi-layered polyimide film of Comparative Example 3 had no m-TB residue. The polyamide acid contained in the adhesive layer forming solution used in preparation of the multi-layered polyimide film of Comparative Example 4 did not have a TPE-R residue and a m-TB residue. The polyamide acid contained in the non-thermoplastic polyimide layer forming solution used in preparation of the multi-layered polyimide film of Comparative Example 5 did not have one or more tetracarboxylic dianhydride residues selected from the group consisting of a BPDA residue and an ODPA residue. The dielectric loss tangent of the non-thermoplastic polyimide layer of the multi-layered polyimide film of Comparative Example 5 was more than 0.0030. In the adhesive layer of the multi-layered polyimide film of each of Comparative Examples 1 to 4, the melting heat of the melting peak was more than 1.0 J/g.

In the multi-layered polyimide films of Comparative Examples 1 to 4, the adhesion strength was less than 10 N/cm. Thus, the multi-layered polyimide films of Comparative Examples 1 to 4 were not excellent in adhesion. The multi-layered polyimide films of Comparative Examples 1 to 3 were rated B for embeddability. Thus, the multi-layered polyimide films of Comparative Examples 1 to 3 were not excellent in embeddability. In the multi-layered polyimide film of Comparative Example 5, all layers had a dielectric loss tangent of more than 0.0040. Thus, the multi-layered polyimide film of Comparative Example 5 did not have a reduced dielectric loss tangent.

The above results showed that according to one or more embodiments of the present invention, it was possible to provide a multi-layered polyimide film which has a reduced dielectric loss tangent while having a bond property to a metal layer, and a method for producing the multi-layered polyimide film.

DESCRIPTION OF REFERENCE SIGNS 10 multi-layered polyimide film
11 non-thermoplastic polyimide layer
12 adhesive layer
13 metal layer
20 metal-clad laminate Although the disclosure has been described with respect to only a limited number of embodiments, those skilled in the art, having benefit of this disclosure, will appreciate that various other embodiments may be devised without departing from the scope of the present disclosure. Accordingly, the scope of the invention should be limited only by the attached claims.

What is claimed is:
1. A multi-layered polyimide film comprising:
a non-thermoplastic polyimide layer, and
an adhesive layer that is disposed on at least one surface of the non-thermoplastic polyimide layer and contains polyimide,
wherein:
a dielectric loss tangent of the non-thermoplastic polyimide layer at a frequency of 10 GHz, a temperature of 23° C., and a relative humidity of 50% is 0.0030 or less,
the adhesive layer has no melting peak or has a melting heat of 1.0 J/g or less at a melting peak in a temperature range of 100° C. or higher and 420° C. or lower, and
the polyimide contained in the adhesive layer has one or more tetracarboxylic dianhydride residues selected from the group consisting of a pyromellitic dianhydride residue and a 3,3',4,4'-biphenyltetracarboxylic dianhydride residue, and one or more diamine residues selected from the group consisting of a 1,3-bis(4-aminophenoxy) benzene residue and a 4,4'-diamino-2,2'-dimethylbiphenyl residue,
a non-thermoplastic polyimide in the non-thermoplastic polyimide layer comprises diamine residues comprising a p-phenylenediamine residue and a 1,3-bis(4-aminophenoxy) benzene residue,
a content ratio of the p-phenylenediamine residue to the total amount of the diamine residues constituting the non-thermoplastic polyimide is 60 mol % or more and 95 mol % or less,
a content ratio of the 1,3-bis(4-aminophenoxy) benzene residue to the total amount of the diamine residues constituting the non-thermoplastic polyimide is 5 mol % or more and 40 mol % or less
wherein the non-thermoplastic polyimide in the non-thermoplastic polyimide layer comprises dianhydride residues comprising a 3,3',4,4'-biphenyltetracarboxylic dianhydride residue, a 4,4'-oxydiphthalic anhydride residue, and a pyromellitic dianhydride residue,
wherein: a content ratio of the 3,3',4,4'-biphenyltetracarboxylic dianhydride residue to the total amount of the dianhydride residues constituting the non-thermoplastic polyimide is 50 mol % or more and 70 mol % or less,
a content ratio of the 4,4'-oxydiphthalic anhydride residue to the total amount of the dianhydride residues constituting the non-thermoplastic polyimide is 20 mol % or more and 40 mol % or less, and
a content ratio of the pyromellitic dianhydride residue to the total amount of the dianhydride residues constituting the non-thermoplastic polyimide is 2 mol % or more and 8 mol % or less.

2. The multi-layered polyimide film according to claim 1, wherein the adhesive layer is disposed on each of both surfaces of the non-thermoplastic polyimide layer.

3. The multi-layered polyimide film according to claim 1, wherein the adhesive layer contains tertiary amine at a content ratio of 1 ppm by mass or more.

4. The multi-layered polyimide film according to claim 1, wherein the non-thermoplastic polyimide layer contains tertiary amine at a content ratio of 1 ppm by mass or more.

5. The multi-layered polyimide film according to claim 1, wherein the polyimide contained in the adhesive layer has no p-phenylenediamine residue.

6. The multi-layered polyimide film according to claim 1, wherein the adhesive layer has no melting peak in a temperature range of 100° C. or higher and 420° C. or lower.

7. The multi-layered polyimide film according to claim 1, wherein the polyimide contained in the adhesive layer comprises the dianhydride residues comprising the pyromellitic dianhydride residue and the 3,3',4,4'-biphenyltetracarboxylic dianhydride residue, wherein:

a content ratio of the pyromellitic dianhydride residue to the total amount of the dianhydride residues constituting the polyimide contained in the adhesive layer is 30 mol % or more and 70 mol % or less, and a content ratio of the 3,3',4,4'-biphenyltetracarboxylic dianhydride residue to the total amount of the dianhydride residues constituting the polyimide contained in the adhesive layer is 30 mol % or more and 70 mol % or less.

8. The multi-layered polyimide film according to claim 7, wherein the polyimide contained in the adhesive layer comprises the diamine residues comprising the 1,3-bis(4-aminophenoxy) benzene residue and the 4,4'-diamino-2,2'-dimethylbiphenyl residue, wherein:

a content ratio of the 1,3-bis(4-aminophenoxy) benzene residue to the total amount of the diamine residues constituting the polyimide contained in the adhesive layer is 60 mol % or more and 95 mol % or less, and a content ratio of the 4,4'-diamino-2,2'-dimethylbiphenyl residue to the total amount of the diamine residues constituting the polyimide contained in the adhesive layer is 5 mol % or more and 40 mol % or less.

9. A metal-clad laminate comprising:

the multi-layered polyimide film according to claim 1, and a metal layer disposed on a main surface of at least one of the adhesive layers of the multi-layered polyimide film.

* * * * *